United States Patent
Agazzi et al.

(10) Patent No.: US 8,265,134 B2
(45) Date of Patent: *Sep. 11, 2012

(54) MULTI-CHANNEL EQUALIZATION TO COMPENSATE FOR IMPAIRMENTS INTRODUCED BY INTERLEAVED DEVICES

(75) Inventors: Oscar Ernesto Agazzi, Irvine, CA (US); Diego Ernesto Crivelli, Cordoba (AR); Hugo Santiago Carrer, Cordoba (AR); Mario Rafael Hueda, Cordoba (AR); German Cesar Augusto Luna, Cordoba (AR)

(73) Assignee: Clariphy Communications, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/839,178

(22) Filed: Jul. 19, 2010

(65) Prior Publication Data

US 2011/0058596 A1    Mar. 10, 2011

Related U.S. Application Data

(63) Continuation of application No. 11/538,025, filed on Oct. 2, 2006, now Pat. No. 7,778,320.

(60) Provisional application No. 60/723,357, filed on Oct. 3, 2005, provisional application No. 60/737,103, filed on Nov. 15, 2005, provisional application No. 60/779,200, filed on Mar. 3, 2006, provisional application No. 60/783,344, filed on Mar. 16, 2006.

(51) Int. Cl.
*H03K 5/159* (2006.01)
(52) U.S. Cl. ........................................ 375/232
(58) Field of Classification Search .............. 375/259, 375/316, 324, 350, 229–236; 379/387.02, 379/340, 398; 324/607; 341/126, 127, 128, 341/155, 156, 159; 333/18, 28 R; 708/300, 708/322, 323

See application file for complete search history.

(56) References Cited

U.S. PATENT DOCUMENTS

| | | | |
|---|---|---|---|
| 5,239,299 A * | 8/1993 | Apple et al. | 341/118 |
| 5,285,480 A | 2/1994 | Chennakeshu et al. | |
| 6,904,110 B2 * | 6/2005 | Trans et al. | 375/350 |
| 7,233,270 B2 | 6/2007 | Lin | |
| 7,330,140 B2 | 2/2008 | Balakrishnan et al. | |
| 7,336,729 B2 | 2/2008 | Agazzi | |

(Continued)

FOREIGN PATENT DOCUMENTS

EP        1 006 697        6/2000

(Continued)

OTHER PUBLICATIONS

European Patent Office, Supplementary European Search Report, European Patent Application No. EP 06849892.2, May 11, 2011, five pages.

(Continued)

*Primary Examiner* — Khanh C Tran
(74) *Attorney, Agent, or Firm* — Fenwick & West LLP

(57) ABSTRACT

A system includes a time-interleaved device. An equalizer effectively can apply different equalization to different interleaved channels. For convenience, these equalizers will be referred to as multi-channel equalizers. In one aspect, an apparatus includes an interleaved device having M interleaved channels, and a multi-channel equalizer coupled to the interleaved device. The multi-channel equalizer is capable of applying a different equalization to different interleaved channels, thus compensating for channel-dependent impairments.

23 Claims, 7 Drawing Sheets

U.S. PATENT DOCUMENTS

| | | |
|---|---|---|
| 7,466,250 B2 | 12/2008 | Buisson |
| 7,564,866 B2 | 7/2009 | Agazzi et al. |
| 7,852,913 B2 | 12/2010 | Agazzi et al. |
| 2001/0004390 A1* | 6/2001 | Pukkila et al. ............... 375/340 |
| 2001/0035997 A1 | 11/2001 | Agazzi |
| 2003/0123585 A1 | 7/2003 | Yen |
| 2003/0219083 A1* | 11/2003 | Graumann ................... 375/341 |
| 2004/0008737 A1 | 1/2004 | McClellan |
| 2005/0190089 A1 | 9/2005 | Draxelmayr et al. |
| 2005/0191059 A1 | 9/2005 | Swenson et al. |
| 2005/0259770 A1* | 11/2005 | Chen ............................ 375/346 |
| 2007/0104288 A1* | 5/2007 | Kim .............................. 375/267 |
| 2008/0049825 A1 | 2/2008 | Chen et al. |

FOREIGN PATENT DOCUMENTS

| | | |
|---|---|---|
| WO | WO 01/65788 | 9/2001 |

OTHER PUBLICATIONS

European Patent Office, Supplementary European Search Report, European Patent Application No. EP 06825423.4, May 11, 2011, five pages.

Ozden, M.T. et al., "Adaptive Volterra Channel Equalisation with Lattice Orthogonalisation," IEE Proc.-Commun., Apr. 1998, pp. 109-115, vol. 145, No. 2.

United States Office Action, U.S. Appl. No. 12/056,084, Aug. 12, 2011, fifteen pages.

United States Office Action, U.S. Appl. No. 12/056,084, Dec. 22, 2010, five pages.

United States Office Action, U.S. Appl. No. 12/335,493, May 4, 2011, six pages.

United States Office Action, U.S. Appl. No. 12/966,987, Feb. 23, 2011, seven pages.

U.S. Appl. No. 60/840,123, filed Aug. 25, 2006.

U.S. Appl. No. 60/908,149, filed Mar. 26, 2007.

European Patent Office, Examination Report, Patent Application No. 06825423.4, Dec. 27, 2011, three pages.

European Patent Office, Examination Report, Patent Application No. 06849892.2, Dec. 27, 2011, three pages.

Nauta, B. et al., "Analog/RF Circuit Design Techniques for Nanometerscale IC Technologies," *Proceedings of ESSCIRC*, 2005, pp. 45-51, Grenoble, France (XP010854902).

Zanikopoulos, A. et al., "A Flexible ADC Approach for Mixed-signal SoC Platforms," *IEEE*, 2005, pp. 4839-4842 (XP010816680).

European Examination Report, European Application No. 06825423.4, Jul. 4, 2012, 4 pages.

European Examination Report, European Application No. 06849892.2, Jul. 24, 2012, 3 pages.

* cited by examiner

MULTI-CHANNEL EQUALIZATION TO COMPENSATE FOR IMPAIRMENTS INTRODUCED BY INTERLEAVED DEVICES

CROSS-REFERENCE TO RELATED APPLICATION(S)

This application is a continuation of U.S. patent application Ser. No. 11/538,025, "Multi-Channel Equalization to Compensate for Impairments Introduced by Interleaved Devices," filed on Oct. 2, 2006, which claims priority under 35 U.S.C. §119(e) to U.S. Provisional Patent Application Ser. No. 60/723,357, "Compensation Of Track And Hold Frequency Response Mismatches In Interleaved Arrays of Analog to Digital Converters for High-Speed Communications Receivers," filed Oct. 3, 2005 by Oscar E. Agazzi et al.; to U.S. Provisional Patent Application Ser. No. 60/737,103, "EDC Transceiver: System and Chip Architecture," filed Nov. 15, 2005 by Oscar E. Agazzi; to U.S. Provisional Patent Application Ser. No. 60/779,200, "MIMO/MLSE Receiver for Electronic Dispersion Compensation of Multimode Optical Fibers," filed Mar. 3, 2006 by Oscar E. Agazzi et al.; and to U.S. Provisional Patent Application Ser. No. 60/783,344, "MIMO/MLSE Receiver for Electronic Dispersion Compensation of Multimode Optical Fibers," filed Mar. 16, 2006 by Oscar E. Agazzi et al. The subject matter of all of the foregoing is incorporated herein by reference in their entirety.

BACKGROUND OF THE INVENTION

1. Field of the Invention

This invention relates generally to equalizers that compensate for impairments introduced by interleaved devices, including for example interleaved analog-to-digital converters (ADC).

2. Description of the Related Art

Time interleaving can be used to increase the effective speed of a device. A non-interleaved device contains a single signal path. An interleaved device contains multiple parallel signal paths (or channels) and signals are time sequentially routed to the different channels. Thus, the effective speed of the device is the aggregate speed of the channels. One example of an interleaved device is an interleaved analog-to-digital converter (ADC). For example, rather than using a single ADC path that operates at 10 Gb/s, eight slower ADC channels that operate at 1.25 Gb/s each can be time interleaved to achieve an effective rate of 10 Gb/s for the interleaved ADC.

Interleaved ADCs are beginning to be applied in high speed communication systems. In these systems, digital signal processing may be used to compensate impairments of the communications channel. Electronic dispersion compensation (EDC) receivers for fiber optic communications at 10 Gb/s and beyond are an example of such systems. Of current interest is the emerging IEEE 802.3aq standard for 10 Gb/s Ethernet over multimode fiber links, which is enabled by EDC technology. Multimode fibers are typically used in local area network (LAN) applications, in links whose length could reach or exceed 300 meters. A large percentage of the existing fiber population consists of legacy fibers that exhibit large multimode dispersion. Interest in EDC for multimode fibers has grown significantly in recent years as a result of the standardization activities of the IEEE 802.3aq Task Force, which is developing the 10GBASE-LRM standard for 10 Gb/s Ethernet over multimode fiber based on the application of EDC technology. This standard is in a draft state, currently documented in *IEEE Draft P802.3aq/D4.0, Draft amendment to: IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment: Physical Layer and Management Parameters for* 10 *Gb/s Operation, Type* 10*GBASE-LRM*, referred to herein as IEEE 802.3aq/D4.0 or 10GBASE-LRM or simply LRM, and incorporated by reference.

The 10 Gb/s data rate in these systems can make interleaved ADCs attractive compared to non-interleaved ADCs. However, it is well known that ADC interleaving techniques are sensitive to mismatches of the offset, gain, and sampling phase among the different channels. These impairments are collectively known as fixed-pattern noise. A less well known form of fixed-pattern noise results from mismatches of the frequency responses of the time interleaved track-and-hold units that typically are located towards the front of each ADC channel.

Communication systems may already use some form of equalization in the receiver, for example to correct for dispersion or other effects. However, these equalizers typically treat the ADC as a black box and do not distinguish between interleaved ADCs and non-interleaved ADCs. To the equalizer, the interleaved ADC is treated effectively as a single path high-speed ADC. The equalizer may compensate for some of the impairments introduced by the ADC. However, since the equalizer does not account for the interleaved nature of the ADC, it may not be able to correct for impairments that vary from channel to channel (i.e., channel-dependent impairments), such as mismatches in the frequency responses of the time interleaved track-and-hold units.

Thus, there is a need for approaches that can compensate for impairments (especially channel-dependent impairments) introduced by interleaved devices.

SUMMARY OF THE INVENTION

The present invention overcomes the limitations of the prior art by providing an equalizer that effectively can apply different equalization to different interleaved channels. For convenience, these equalizers will be referred to as multi-channel equalizers. In one aspect, an apparatus includes an interleaved device having M interleaved channels, and a multi-channel equalizer coupled to the interleaved device. The multi-channel equalizer is capable of applying a different equalization to different interleaved channels.

One example of an interleaved device is an interleaved analog to digital converter (ADC). In one implementation, each ADC channel within the interleaved ADC may include its own track-and-hold unit coupled to ADC conversion circuitry. The M separate track-and-hold units may introduce channel-dependent impairments. The multi-channel equalizer can compensate for these impairments since it can apply different equalization to each ADC channel.

Examples of multi-channel equalizers include maximum likelihood sequence estimators (MLSE) and decision feedback equalizers (DFE). In one implementation, the multi-channel equalizer can be implemented using an N-tap, M-parallel finite impulse response (FIR) filter. Two architectures for the FIR are multiply-accumulate and lookup table-accumulate (where the multiplication is implemented by lookup table).

One specific application is 10 G fiber optic communication systems. For example, interleaved ADCs may be used as part of the receiver for a 10 G system. An equalizer may be used to compensate for impairments, such as implementing electronic dispersion compensation. A multi-channel equalizer can be used to further address channel-dependent impairments introduced by the interleaved ADC (or other interleaved devices).

Different levels of "multi-channelness" are also possible. At one extreme, each equalizer coefficient in the multi-channel equalizer is dedicated exclusively to one and only one of the interleaved channels. In this approach, each of the channels can be adjusted entirely independently of the others. In hybrid approaches, at least some of the equalizer coefficients are shared by at least some (and possibly all) of the interleaved channels. Note that in conventional equalizer approaches, all equalizer coefficients are shared by all interleaved channels (i.e., the same equalization is applied to all channels).

Other aspects of the invention include methods corresponding to the devices and systems described above, and applications for all of the foregoing.

BRIEF DESCRIPTION OF THE DRAWINGS

The invention has other advantages and features which will be more readily apparent from the following detailed description of the invention and the appended claims, when taken in conjunction with the accompanying drawings, in which:

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

Figure 1:
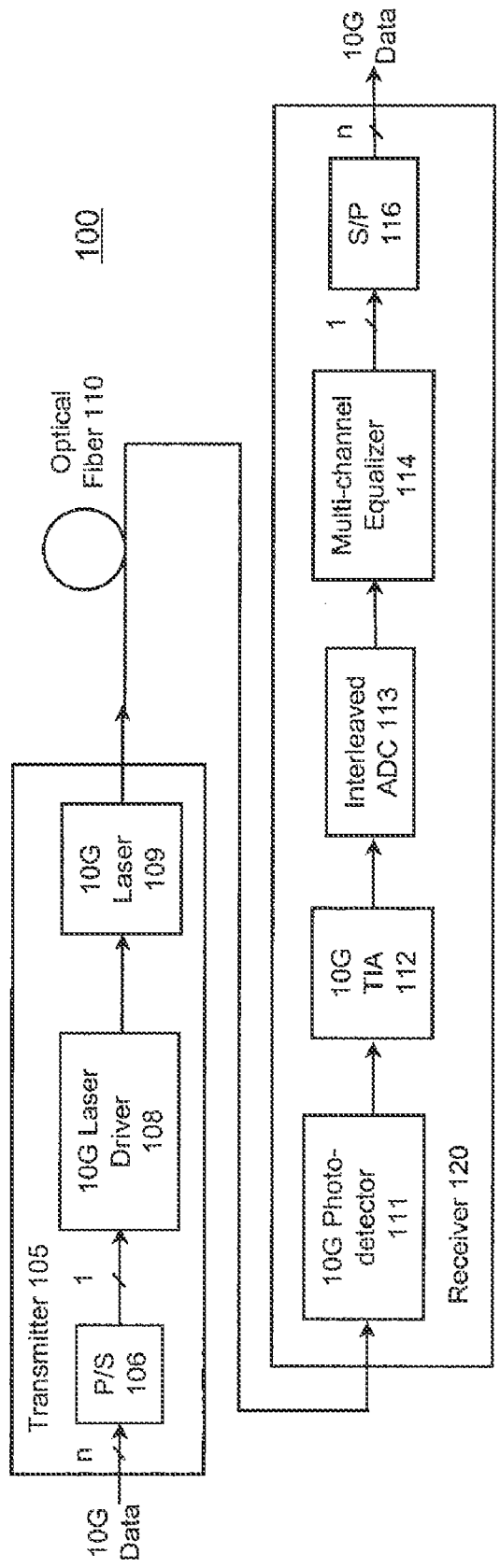
FIG. 1 is a block diagram of one implementation of an optical fiber communications link with multi-channel equalization.

FIG. 1 shows an optical fiber communications link 100 with multi-channel equalization. The link 100 includes a transmitter 105 coupled through optical fiber 110 (the communications channel) to a receiver 120. A typical transmitter 105 may include a serializer or parallel/serial converter (P/S) 106 for receiving data from a data source on a plurality of parallel lines and providing serial data to a laser driver 108. The driver 108 then drives a laser source 109, for example a 1310 nm Fabry-Perot or DFB laser. The laser source 109 launches the optical waveform carrying the digital data on optical fiber 110. When the optical fiber 110 is multimode fiber (MMF), the optical waveform can be launched into the MMF 110 using either center or offset launch conditions.

On the receive side, a typical receiver 120 includes a photodetector 111 for receiving and detecting data from the optical fiber 110. The detected data is typically processed through a transimpedance amplifier (TIA) 112. The resulting analog signal is converted to digital form by an interleaved ADC 113. The interleaved ADC contains M parallel ADC channels. Each ADC channel typically includes a track-and-hold unit (T&H unit) followed by the actual ADC conversion circuitry. In this example, a multi-channel equalizer 114 corrects channel-dependent impairments from the interleaved ADC, as well as other impairments such as dispersion introduced by the optical fiber 110. The recovered data may then be placed on a parallel data interface through a serial/parallel converter (S/P) 116. For simplicity, auxiliary functions such as automatic gain control or timing recovery are not shown in this figure.

There has been a trend in optical networking towards ever-increasing data rates. While 100 Mbps was once considered extremely fast for enterprise networking, attention has recently shifted to 10 Gbps, 100 times faster. As used in this application, 10 Gigabit (abbreviated as 10 G or 10 Gbps or 10 Gbit/s) systems are understood to include optical fiber communication systems that have data rates or line rates (i.e., bit rates including overhead) of approximately 10 Gigabits per second. This includes, for example, LRM and SFF-8431, a specification currently under development by the SFF Committee that will document the SFP+ specifications for 10 G Ethernet and other 10 G systems. While 10 G systems serve as convenient examples for the current invention, the current invention is not limited to 10 G systems. Examples of other systems to which the current invention could be applied include Fibre Channel systems, which currently operate at speeds from 1 Gbps to 10 Gbps, as specified by the Technical Committee T11, a committee of the InterNational Committee for Information Technology Standards (INCITS).

In many 10 G applications, the electronic and optical components at each end of the link are housed in a transceiver module. In some applications, these modules are fixed to a host circuit board, and in other applications they are "pluggable" modules that can be inserted into and removed from a cage (or socket) that is fixed to the host circuit card. Multi-Source Agreements (MSAs) have been developed to achieve some degree of interoperability between modules from different manufacturers. Example MSAs include XFP and SFP+, in which the 10 Gbps electrical I/O interface to the host is serial, and X2, XPAK, and XENPAK, in which the 10 Gbps electrical interface to the host is parallelized to four lanes in each direction.

Due to the current interest in 10 G systems, the examples in this application are based on 10 G data links over MMF, specifically using the 10 GBASE-LRM draft standard. Legacy MMF suffers from significant modal dispersion. On some MMF, particularly under center launch conditions, the response may vary over time as a result of vibrations or mechanical stress on the fiber. Noise in MMF links is dominated by relative intensity noise, modal noise and thermal noise. While RIN and MN are non-Gaussian, thermal noise, mainly produced by the TIA at the input of the receiver, is Gaussian. In the following examples, for simplicity to illustrate the principles of the multi-channel equalizer, the noise is assumed Gaussian. This is a reasonable approximation since thermal noise is typically dominant in the LRM channel. Nonlinearity may be introduced in the signal by the laser and/or the TIA and post amplifier. Again for simplicity, non-linearity is neglected in the following performance analysis.

One place where the following examples deviate from the LRM standard is the fiber length. The draft standard specifies 220 meters, but the following examples use a 300 meter length. This is motivated by the large number of fibers in the field whose length approaches 300 meters, and by the fact that users of EDC technology have expressed a desire for this extended reach. Although the LRM channel is used in the following examples in order to make them more concrete, the techniques illustrated are general and they can be used in many other fiber optic or other communications applications. Other fiber optic applications for which these techniques can be used include, for example, systems using single mode optical fiber as the communications medium.

Figure 2:
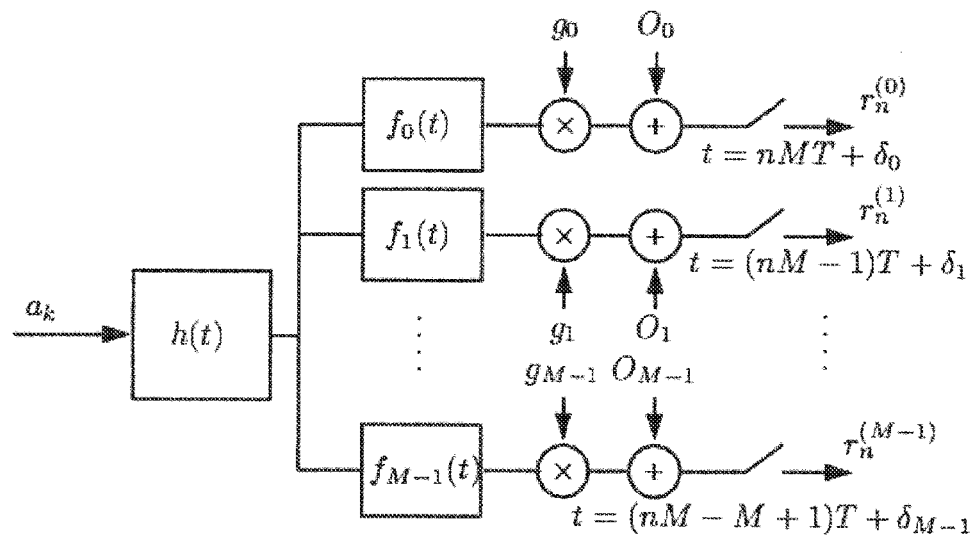
FIG. 2 is a block diagram modeling the interleaved ADC as part of the communications channel.

FIG. 2 shows a model of the communications link where the impairments of the analog front end, particularly the M-parallel time interleaved ADC system 113, are explicitly shown as part of the communications channel. Here, h(t) models the optical channel 110 response as well as the receive filter and any other linear element present in the link and $a_K \in \{-1, +1\}$ are the transmitted symbols. Blocks $f_O(t)$ to $f_{M-1}(t)$ model the frequency responses of each track-and-hold (T&H) unit in the interleaved ADC. This response can vary from one ADC channel to the next. Gain errors and offsets in the ADC channels are modeled by $g_O$ to $g_{M-1}$ and $O_O$ to $O_{M-1}$, respectively. Finally, $\delta_O$ to $\delta_{M-1}$ model sampling time errors. The output of the system is comprised by M parallel samples, $r_n^{(0)}$ to $r_n^{(M-1)}$, which will be processed by the multi-channel equalizer 114. Note that the superscript identifies baud spaced samples, whereas subscript n represents samples spaced M-baud periods apart. For simplicity, noise sources such as additive white Gaussian noise (AWGN) and quantization noise are not explicitly shown in the diagram.

Figure 3:
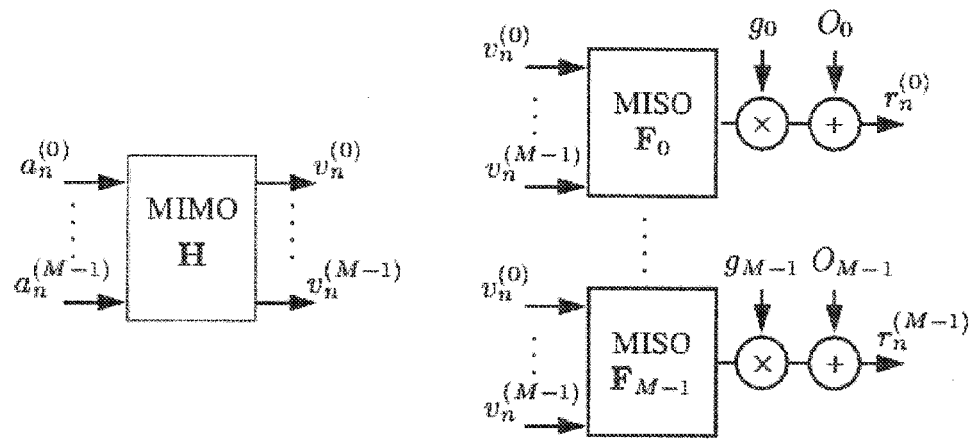
FIG. 3 is a MIMO model of the communications channel of FIG. 2.

First transform filters h(t) and $f_O(t)$ through $f_{M-1}(t)$ from the continuous to the sampled time domain. The transformation assumes ideal sampling (sampling without phase errors). Sampling time errors will be modeled with a multiple-input, multiple-output (MIMO) interpolation filter, as will be seen later. Defining:

$$a_n^{(i)} = a_{(nM-i)} \quad i=0, \ldots, M-1, \quad (1)$$

a MIMO description of this communications link is obtained by converting the single-input, single-output (SISO) filters h(t) and $f_O(t)$ through $f_{M-1}(t)$ to a MIMO and a multiple-input, single-output (MISO) representation, respectively, as shown in FIG. 3. The MIMO and MISO models can be combined to obtain a single MIMO representation.

Figure 4:
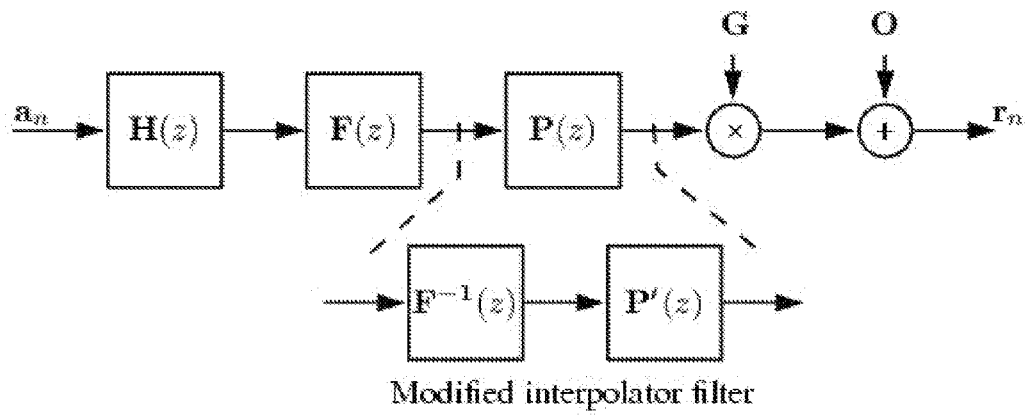
FIG. 4 is another representation of the MIMO model of FIG. 3.

In this way, the MIMO model accepts M-dimensional input vectors whose components are transmitted symbols, and produces M-dimensional output vectors whose components are signal samples, at a rate 1/MT. FIG. 4 shows a diagram of the MIMO model. The vector of input symbols $a_n$ feeds the communications channel response matrix H(z). The output of this channel is fed to the T&H matrix filter F(z), which models the independent T&H responses. P(z) models the sampling time errors. It can be seen as a block that interpolates the samples taken without sampling errors at the output of the channel and generates M outputs with sampling errors. With identical T&H responses, the sampling time errors can be modeled using an interpolation filter that generates samples with phase errors for each output of the MIMO model. When T&H responses are taken into account, a possible way to continue to use the interpolator filter is to invert the response of F(z), as is shown inside the dotted line of FIG. 4. While the use of an interpolation filter is completely accurate only when samples are free of aliasing, it can still be used as an approximation when there is some aliasing owing to T-spaced sampling and excess bandwidth greater than zero. This approximation is valid when sampling time errors are small. Finally, matrix G and vector O represent gain and offsets errors, respectively. From FIG. 4, the MIMO model can be written as:

$$r(z) = GP(z)F(z)H(z)a(z) + O(z). \quad (2)$$

Grouping the factors in the first term of the sum as S(z)=GP(z)F(z)H(z), the entire MIMO response of the system can be represented in the z-domain and time-domain, respectively, as:

$$r(z) = S(z)a(z) + O(z) \quad (3A)$$

$$r_n = \sum_{l=-\infty}^{\infty} S_l a_{n-l} + O. \quad (3B)$$

Given the model of Eqn. (3), the joint compensation of the channel impairments (such as intersymbol interference (ISI)) and the analog front-end (AFE) errors can be formulated as the general equalization problem of a MIMO channel. Common equalization techniques include feed forward equalization, decision feedback equalization, and maximum likelihood sequence estimation.

Figure 5:
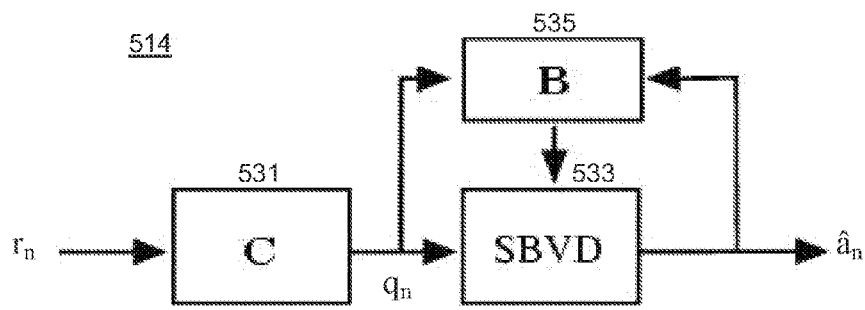
FIG. 5 is a block diagram of a maximum likelihood sequence estimator suitable for use as a multi-channel equalizer.

FIGS. 5-8 illustrate an example using maximum likelihood sequence estimation (MLSE). FIG. 5 is a block diagram of an MLSE equalizer. This is motivated by the fact that the optimal receiver for an intersymbol interference channel in the presence of Gaussian noise consists of a whitened matched filter followed by a maximum likelihood sequence detector. The equalizer 514 includes a MIMO-FFE (C) 531 coupled to a sliding block Viterbi decoder (SBVD) 533 and a MIMO channel estimator (B) 535. This architecture is able to compensate for the ISI of the MMF, as well as for the impairments of the receiver front-end, such as the independent T&H responses, gain errors, sampling phase errors and offset.

In one implementation, the MIMO-FFE 531 is described by the following equation:

$$q_n = \sum_{l=0}^{N_f-1} C_l r_{n-l} \quad (4)$$

where $N_f$ is the number of M×M-matrix taps ($C_i$) of the forward equalizer.

Let K be the total number of bits transmitted. It is convenient to assume, without loss of generality, that K=NM with N integer. The maximum-likelihood sequence detector chooses, among the $2^K$ possible sequences, the one $\{\hat{a}_k\}$ ($\kappa=1, \ldots, K$) that minimizes the metric:

$$m = \sum_{n=1}^{N} \left\| q_n - B(\hat{A}_n) \right\|^2, \quad (5)$$

where B(.) is a function that models the response of the equalized channel with memory $\Delta-1$, and $\hat{A}_n = (\hat{a}_{nM}, \hat{a}_{nM-1}, \ldots \hat{a}_{(n-1)M-\Delta+2})$. Note that each component of B(.) depends only on $\Delta$ consecutive received bits. This formulation assumes that in general the function B(.) is nonlinear. The minimization of Eqn. (5) can be efficiently implemented using the Viterbi algorithm. The required number of states of the Viterbi decoder is $S=2^{\Delta-1}$. The SBVD 533 is generally a suitable form of the Viterbi algorithm for a MIMO receiver. The input to the SBVD 533 is the FFE 531 output vector $q_n$, and the output is a block of M detected symbols $\hat{a}_n$. For each of the M components of $B(\hat{A}_n)$, the MIMO channel estimator 535 generates the 2S expected values of the corresponding component of the $q_n$ vector for all possible combinations of the $\Delta$ most recently received bits (corresponding to the 2S branch metrics in the trellis diagram). The MIMO channel estimator 535 can be implemented using M lookup tables, each lookup table having 2S entries. While the vector $B(\hat{A}_n)$ can in general take on $2^MS$ values, dynamic programming techniques inherent in the Viterbi algorithm reduce the computational requirement to that of computing the 2MS branch metrics corresponding to the individual components of $B(\hat{A}_n)$.

The coefficients of the FFE 531 and the lookup tables can be iteratively adapted using the well known LMS algorithm, as follows for iteration j:

$$e_n = B^j(\hat{A}_n) - q_n, \quad (6)$$

$$C_l^{(j+1)} = C_l^{(j)} + \beta e_n r_{n-1}^{(T)}, \quad (7)$$

$$B^{j+1}(\hat{A}_n) = B^j(\hat{A}_n) - \gamma e_n \quad (8)$$

where $(.)^T$ means transpose and $\beta$ and $\gamma$ are the algorithm step sizes of the FFE and channel estimator, respectively. The notation of Eqns. (6)-(8) was slightly modified to include the iteration number j of the LMS update as a superscript.

Note that the absence of a reference level in Eqns. (6)-(8) defines coefficients of the FFE 531 and the channel estimator 535 only up to a scale factor. One possible way to define the scale is to set one of the coefficients of the FFE 531 to a specific value which is kept fixed (not adapted).

Figure 6:
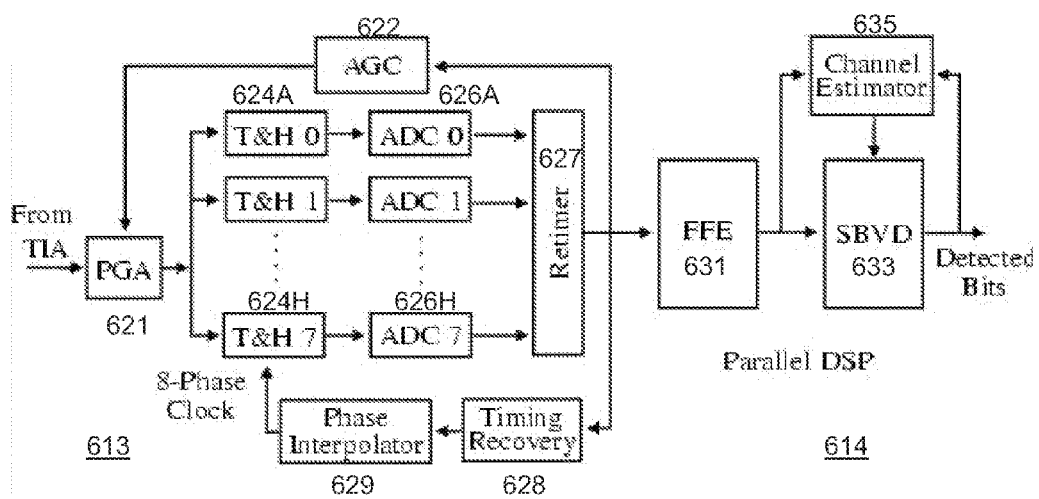
FIG. 6 is a block diagram of a receiver architecture using the MLSE of FIG. 5.

FIG. 6 shows a simplified block diagram of the relevant parts of a receiver architecture. The input signal comes from a photodetector 111 and a TIA 112, which in this diagram will be treated as external. This signal is converted to digital form by the interleaved ADC 613. This is followed by a multi-channel equalizer 614 which, in this case, is based on MLSE.

In more detail, the level of the input signal is adjusted by a programmable gain amplifier (PGA) 621, whose gain is controlled by a digital automatic gain control (AGC) 622. The output of the PGA 621 is applied to an array of eight interleaved T&H amplifiers 624A-H followed by eight ADC circuits 626A-H. The T&H amplifiers 624 take samples of the input signal at a rate of 1289.0624 Ms/s each, but the sampling clocks of the different interleaves are staggered in phase by 96.97 ps, so that the signal is sampled at an aggregate rate of 10.3125 Gs/s. This is also the symbol rate in the LRM channel. Therefore, the receiver samples the signal at the symbol rate.

The phases of the eight sampling clocks are controlled by the digital timing recovery circuit 628 through an analog phase interpolator 629. In practice, small errors in the phases of these clocks exist as a result of slight mismatches in the delays of the clock distribution network, strength of clock buffers etc. These phase errors are one of the causes of the fixed-pattern noise which in the above formulation is a part of the channel model. Other sources of fixed-pattern noise also included in the channel model are gain and offset mismatches in the T&Hs 624 and ADCs 626, and frequency response mismatches of the T&Hs 624. The outputs of the eight ADCs 626 are time-aligned 627 and passed to the parallel-processing DSP that implements the MLSE 614. The most important DSP blocks are the AGC 622, the Timing Recovery 628, the MIMO-FFE 631, the sliding block Viterbi decoder 633, and the MIMO channel estimator 635. In this implementation the number of taps of the FFE 631 can be programmed by the user. This allows the user to trade performance for power consumption. For similar reasons, the number of states of the Viterbi decoder 633 can also be set by the user.

The parallel implementation of the FFE 631 is closely related to the MIMO structure. From the MIMO representation, the FFE 631 can be expanded as a convolution matrix as follows:

$$C = \begin{bmatrix} c_0^{(0)} & c_1^{(0)} & \ldots & c_{L_f-1}^{(0)} & 0 & \ldots & 0 \\ 0 & c_0^{(1)} & c_1^{(1)} & \ldots & c_{L_f-1}^{(1)} & \ldots & 0 \\ 0 & 0 & & \ldots & & & 0 \\ 0 & 0 & \ldots & c_0^{(M-1)} & c_1^{(M-1)} & \ldots & c_{L_f-1}^{(M-1)} \end{bmatrix}, \quad (9)$$

where $L_f$ is the number of taps used. Then the output samples are computed as:

$$q_n = C[r_{(nM)} r_{(nM-1)} \ldots r_{((n-1)M+L_f-1)}]^T \quad (10)$$

The parallel implementation of the FFE 631 can be represented by M FIR filters, which is precisely what Eqn. (10) represents. In the presence of mismatches in the AFE, the coefficients in different rows of Eqn. (9) are different. This effectively allows different equalization to be applied to each of the interleaved channels (although the equalization can be applied after the interleaved channels have been recombined). The MIMO structure of the Viterbi decoder 633 is also essentially identical to the parallel processing realization. The only modification is that branch metrics associated with different components of the input vector $q_n$ are computed using different components of the channel estimator function B, which is not the case in a traditional parallel implementation. Although in Eqns. (9) and (10) the implicit assumption is made that the DSP parallelization factor equals the dimension of the MIMO channel, in practice this constraint is not required.

Figure 7:
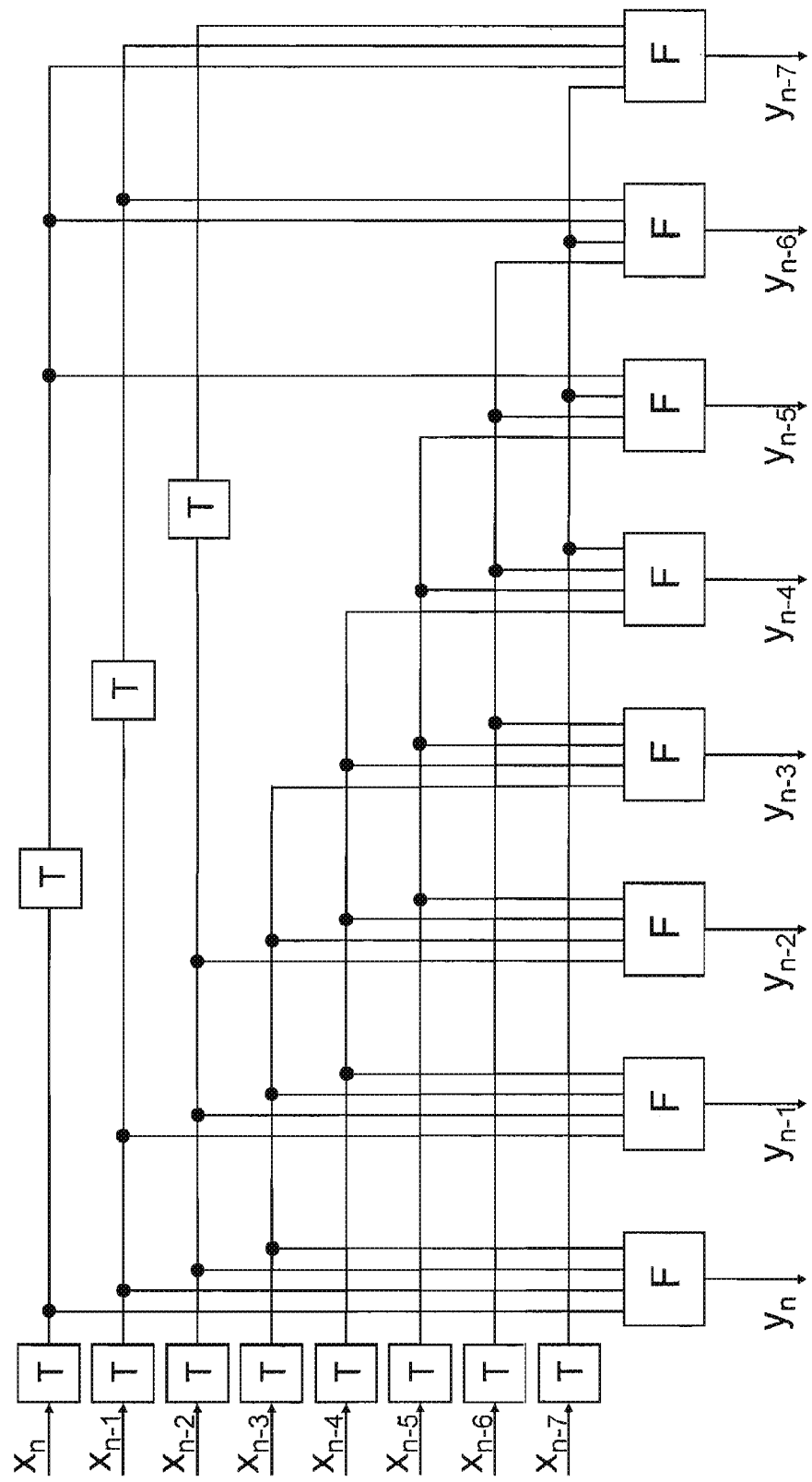
FIG. 7 is a block diagram of a 4-tap, 8-parallel FIR suitable for use with the MLSE of FIG. 6.

FIGS. 7 and 8 illustrate example implementations of parallel FIR filters suitable for implementing Eqn. (9). FIG. 7 is a block diagram of a 4-tap, 8-parallel FIR. That is, this FIR implements $L_f=4$ and M=8 in Eqn. (9). The $x_n$ are the input data and the $y_n$ are the filtered, output data. Note that $x_n$ and $x_{n-1}$ represent data that are spaced 1-baud period apart but consecutive samples of $x_n$ represent data that are spaced M-baud periods apart. The blocks marked T are delay lines, each of which represents a delay of M-baud periods. The blocks marked F are processing elements, each of which implements the multiply and accumulate represented by one row of the matrix in Eqn. (9).

Figure 8B:
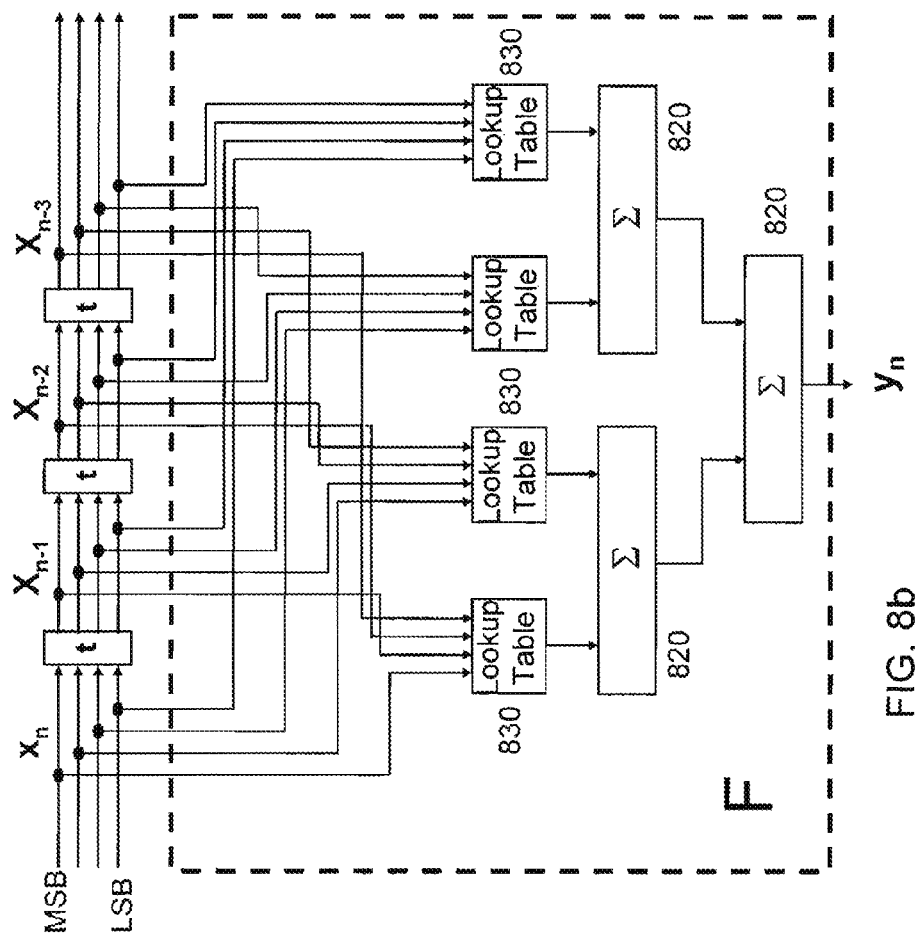
FIGS. 8a and 8b are block diagrams of different implementations of the processing elements used in the parallel FIR of FIG. 7.
Figure 8A:
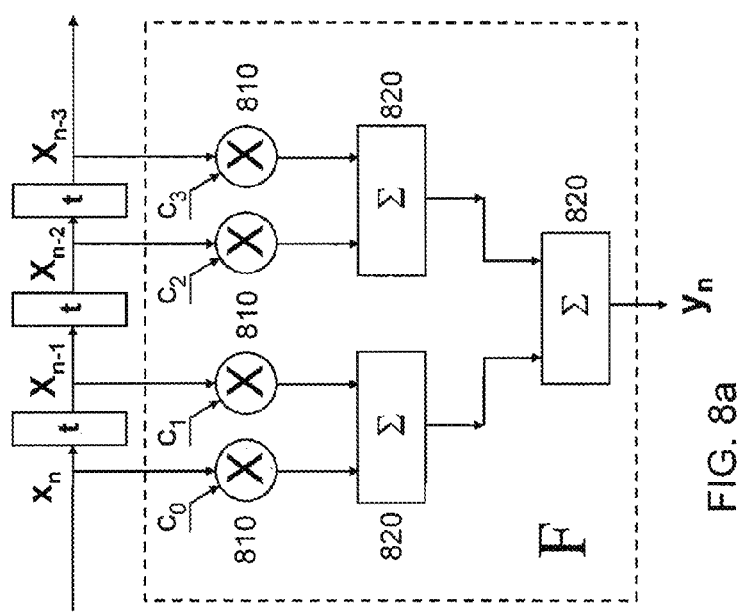

FIGS. 8a and 8b show two different implementations of the processing element F. FIG. 8a is based on a multiply-accumulate architecture. FIG. 8b is based on a lookup table-accumulate architecture. In both of these figures, the inputs $x_n$ are represented by a delay line structure, where each delay t is 1-baud period. This is merely a symbol indicating the relative timing of the inputs $x_n$, the actual implementation of the FIR may or may not have this specific delay line structure. In FIG. 8a, multipliers 810 are used to multiply the inputs $x_n$ by the tap weights $c_n$ to produce intermediate products. Adders 820 then sum the intermediate products to produce the result y. In FIG. 8b, the multipliers 810 are replaced by lookup tables 830 that output the intermediate product, but by a lookup table operation rather than by a multiplication operation. Both of these implementations are suitable for single chip implementation in standard 90 nm CMOS technology using current technology.

Figure 9:
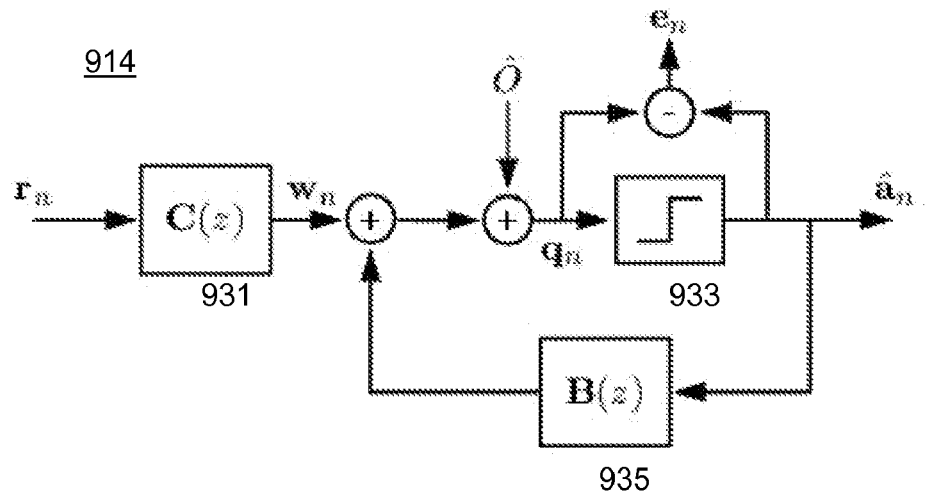
FIG. 9 is a block diagram of a decision feedback equalizer suitable for use as a multi-channel equalizer.

Multi-channel equalizers other than MLSE can also be used. For example, FIG. 9 is a block diagram of a decision feedback (DFE) equalizer 914 suitable for use as the multi-channel equalizer. The equalizer 914 includes a MIMO-FFE (C) 931 and a MIMO-FBE (B) 935. This architecture is able to compensate for independent T&H responses, gain errors, sampling errors and offset errors. The offset estimator $\hat{O}$ at the input of the slicer 933 can be calculated based on the error signal $e_n$.

DFE equalization is described by the following equation:

$$q_n = \sum_{l=0}^{N_f-1} C_l r_{n-l} + \sum_{l=0}^{N_b-1} B_l \hat{a}_{n-l-1} + \hat{O}_n \quad (11)$$

where $N_f$ and $N_b$ are the number of M×M-matrix taps of the feedforward equalizer 931 (C) and feedback equalizer 935 (B), respectively.

The coefficients of C and B can be iteratively adapted using the LMS algorithm, as follows for iteration j:

$$e_n = a_n - q_n, \quad (12)$$

$$C_l^{(j+1)} = C_l^{(j)} + \beta e_n r_{n-l}^{(T)} \quad (13)$$

$$B_l^{(j+1)} = B_l^{(j)} + \gamma e_n \hat{a}_{n-l-1}^{(T)} \quad (14)$$

where $(.)^T$ means transpose, and $\beta$ and $\gamma$ are the algorithm step sizes. The offset estimation vector $\hat{O}$ can be calculated as:

$$\hat{O}^{(j+1)} = \hat{O}^{(j)} + \rho e_n, \quad (15)$$

where $\rho$ is the algorithm step size.

Figure 10:
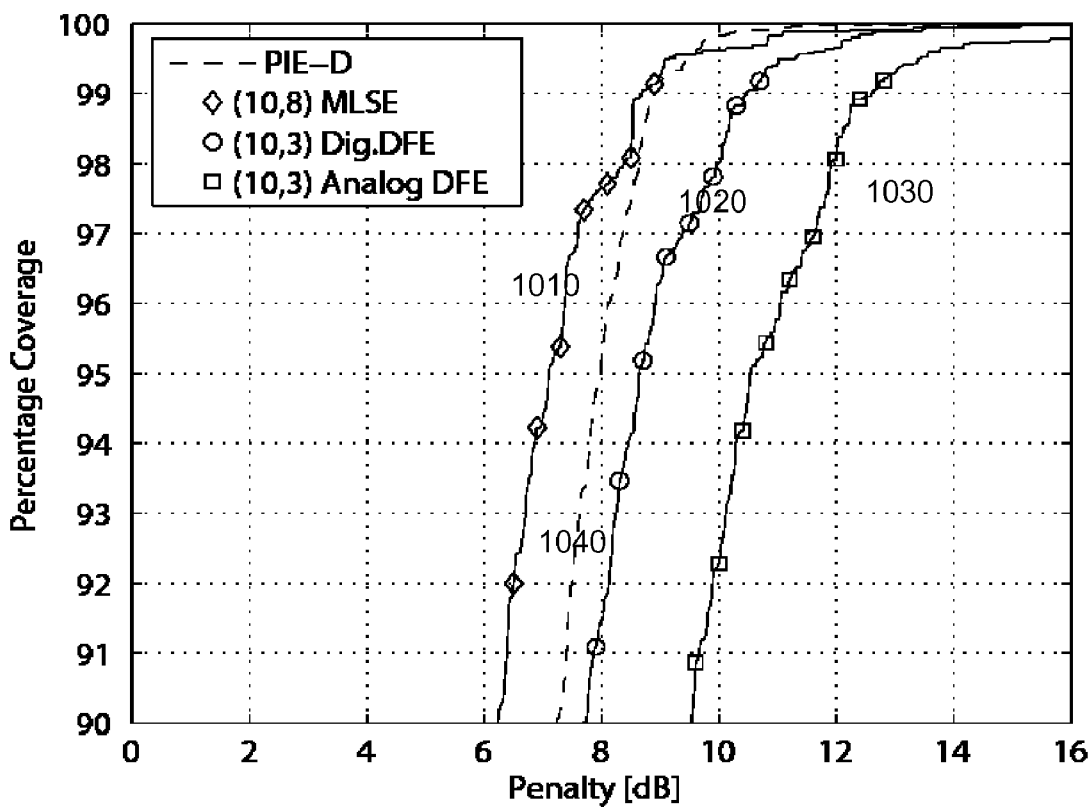
FIG. 10 displays cumulative histograms of fiber coverage versus penalty for different types of equalizers.

FIG. 10 presents results of a simulation study of the receiver using the multi-channel MLSE described above. Two different simulators were used. One of them, called OCCAM (Optical Communication Channel Analytic Model), is a fast Matlab-based tool that computes performance by solving the receiver equations. Because of its speed, this tool allows fundamental limits to be rapidly explored on large databases. The tool is particularly useful to compare different architectures, including limiting cases, for example finite or infinite decision feedback equalizers (DFE), finite or infinite MLSE receivers, etc. One particularly important ideal receiver is a DFE with infinite number of feedforward and feedback taps. This receiver is used in the 10GBASE-LRM draft standard to define an implementation-independent performance measure, called PIE-D ("penalty of the ideal equalizer—DFE"). The other simulator, called LiSST (Lightwave System Simulation Tool) is a C++ based fixed-point time domain simulator. It is asynchronous and event-driven. Therefore, it allows an arbitrary number of clock domains to be simulated. It accurately models nonstationary effects, such as timing recovery acquisition, jitter, etc. It is bit and clock cycle accurate, and it models the behavior of the DSP hardware with great accuracy. Extensive consistency checks of the two simulators have been carried out with excellent results.

The performance measure used for all receivers in this study is the probability of error $P_e$. However, for convenience of presentation, the signal to noise ratio (SNR) is also defined. It is related to $P_e$ by $\sqrt{SNR}=Q^{-1}(P_e)$, where Q(x)=0.5erfc(x/$\sqrt{2}$). A quantity more commonly used by the optical communications community is the penalty, which for this application can be defined as $P=30-SNR_{dB}$. In the optical communications community, it is common to measure penalties in optical dB but this disclosure uses electrical dB. Penalties expressed in optical dB are one half those reported here. Penalty is a function of both the channel and the receiver. Higher penalties correspond to lower performance and higher error rates. For these purposes, it is sufficient to regard penalty as a measure of performance, which is related to $P_e$. OCCAM computes $P_e$ for each receiver using well known theory. LiSST computes $P_e$ using time domain simulations.

The performance of the multi-channel MLSE receiver has been simulated using the "Gen 67 FDDI Monte Carlo data set," *IEEE 802.3aq Task Force*, January 2005. [Online] Available: http://grouper.ieee.org/groups/802/3/aq/public/tools/MonteDCarlo/OM1. For clarity, only the (10,8) configuration of the MIMO-MLSE receiver is shown, where the first number in the pair refers to the number of FFE taps, and the second is the number of states of the Viterbi decoder. Recall from the above discussion that these parameters can be user programmable. For comparison, the performance of a "single-channel" infinite DFE (denoted PIE-D) and a single-channel DFE with 10 T-spaced feedforward taps and 3 feedback taps is also presented (denoted (10,3) Dig. DFE). These single-channel DFE cases are used for comparison to the multi-channel MLSE receiver and no impairments due to interleaving are introduced in the single-channel DFE cases. Recent literature has described analog implementations of 10 Gb/s equalizers where the delay line of the adaptive FIR filter is implemented using second order sections as delay elements. The parameters of the second order section are optimized to achieve maximum bandwidth and an approximately linear phase characteristic. However, an intrinsic limitation of this architecture is that the delay elements have limited bandwidth and they degrade the equalizer performance. A DFE using these techniques (denoted (10,3) Analog DFE) has also been simulated for comparison with the other architectures. The power spectral density $N_o$ of noise at the input of the receiver in all the configurations simulated is set according to the methodology described in N. Swenson et al., "Explanation of IEEE 802.3, clause 68 TWDP." [Online]. Available at http://ieee802.org/3/aq/public/tools/TWDP.pdf. The value of $N_o$ that results is such that a matched filter receiver operating in the absence of dispersion would have an SNR at the slicer of 30 dB.

FIG. 10 shows the simulation results in the form of cumulative histograms of fiber coverage versus penalty. For a given x-value of penalty, the y-value on the curve represents the percentage of fibers in the database for which the penalty of the corresponding receiver is less than or equal to the given penalty. Using the 99% level as an example, approximately 99% of fibers in the database have a penalty of approximately 9 dB or less when using the (10,8) MLSE (curve 1010). The histograms show that the MIMO-MLSE receiver (curve 1010) performs approximately 2 dB better than the single-channel digital DFE (curve 1020), and approximately 4 dB better than the analog DFE (curve 1030) at 99% coverage. Curve 1040 shows the PIE-D case (infinite single-channel DFE). An 8-state multi-channel MLSE receiver without an FFE has also been simulated. Such an architecture has been considered for single-mode fiber applications. Although for clarity the corresponding curve is not shown in FIG. 10, the penalty at 99% coverage for this receiver is 3.5 dB higher than for the multi-channel (10,8) MLSE. This shows that feedforward equalization is desirable in the LRM channel.

The effectiveness of the MIMO architecture to compensate for fixed-pattern noise was tested using LiSST. Simulations were run over 15 MMF channels selected randomly from the Cambridge database ("108 fiber model," *IEEE 802.3aq Task Force*, October 2004. [Online] Available: http://grouper.ieee- .org/groups/802/3/aq/public/tools/108fiberModel). Each channel in this database is uniquely identified by a fiber number and a launch offset (in microns). The selected channels are identified by the following fiber/offset pairs: (57/17), (88/20), (84/17), (10/17), (108/20), (50/17), (19/20), (55/20), (57/20), (10/20), (60/23), (20/23), (70/23), (59/23), and (27/17).

Open loop T&Hs are among the most suitable for high speed applications. The transfer function of the T&H is modeled as a two real pole system. One of the poles models the input buffer, whereas the other models the T&H circuit in track mode. In this example, the poles are nominally located at −9 and −10 GHz. With process variations of ±20%, the poles fall in the range K(−9,−10) GHz with K=0.8 to 1.2. These variations across the constituent T&Hs in the interleaved array are responsible for one of the components of fixed-pattern noise. The values of mismatch used in the simulations for the other components of fixed-pattern noise were: ±5% for phase errors, ±5% for gain errors and ±5% for offset. The following cases are considered: 1) No mismatches; 2) Mismatch errors and MIMO equalizer; 3) Mismatch errors and SISO equalizer. SISO equalizer means a single set of coefficients for all the MIMO responses (i.e., single-channel equalizer). The SNR loss of the MIMO scheme is defined as the difference of SNR between cases 2 and 1 and the SNR loss for the SISO scheme as the equivalent difference between cases 3 and 1.

Table I shows the results. To simplify the presentation, the results are averaged over the set of 15 fibers described above. The first four columns Offset, Gain, Samp. and BW are the SNR loss where there is only offset error, only gain error, only sampling phase errors or only frequency response (i.e., pole location) errors, respectively. "All, No Offset" is the SNR loss with all impairments except offset, and "All" is the SNR loss for all impairments.

The fact that the SNR loss of the multi-channel equalizer is nonzero is a result of noise enhancement owing to the FFE equalization of the different channels. The table shows a total degradation of 7.86 dB for the SISO scheme. The degradation drops to 0.23 dB for the MIMO scheme. From these results, it can be seen that the multi-channel MLSE architecture presented can effectively compensate for mismatch impairments on the receiver front-end.

TABLE I

Summary of SNR Loss (dB)

| Architecture | Offset | Gain | Samp | BW | All, No Offset | All |
|---|---|---|---|---|---|---|
| SISO | 6.22 | 1.99 | 1.48 | 1.86 | 4.38 | 7.86 |
| MIMO-MLSE | 0.01 | 0.04 | 0.04 | 0.11 | 0.20 | 0.23 |

Figure 11:
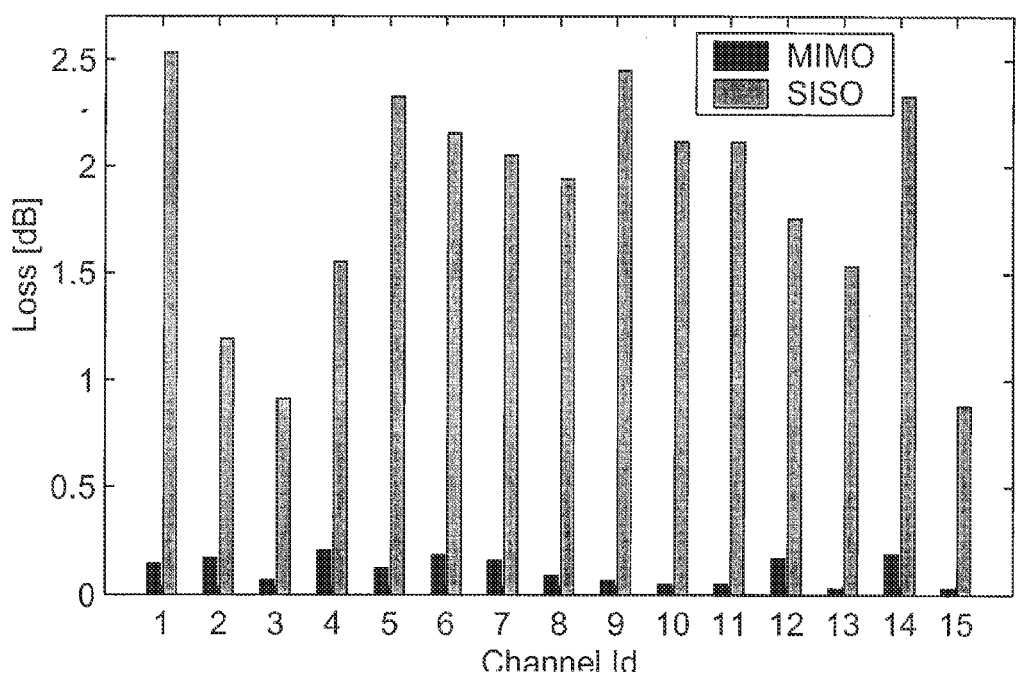
FIG. 11 displays bar charts comparing SNR loss for a multi-channel equalizer compared to a single-channel equalizer for different types of fibers.

Simulations similar to Table I were also run for the multi-channel DFE described above. FIG. 11 shows the results of a simulation with only the frequency response errors (i.e., pole location errors), comparing SNR loss of the MIMO-DFE to a SISO-DFE for each of the fifteen randomly selected fibers. The effectiveness of the MIMO-DFE is clear. FIG. 11 shows penalties as high as 2.4 dB (caused exclusively by the T&H frequency response mismatch) for the SISO scheme.

Table II summarizes a simulation analogous to that for Table I. That is, four different impairments were simulated: offset, gain error, sampling phase error and frequency response error. Columns 2-5 tabulate results for each error individually. "All, No Offset" is the SNR loss with all impairments except offset, and "All" is the SNR loss for all impairments. Note that for this simulation, the MIMO-DFE has the same average performance as the MIMO-MLSE.

TABLE II

Summary of SNR Loss (dB)

| Architecture | Offset | Gain | Samp | BW | All, No Offset | All |
|---|---|---|---|---|---|---|
| SISO | 6.22 | 1.99 | 1.48 | 1.86 | 4.38 | 7.86 |
| MIMO-DFE | 0.01 | 0.04 | 0.04 | 0.11 | 0.20 | 0.23 |

The examples described above were based on 10 G fiber optic communications over multimode fiber, with special emphasis on the 10GBASE-LRM draft standard. This example was chosen partly because there is currently significant interest in this application. It was chosen also partly because certain principles are more easily described using a specific example. However, the invention is not limited to this particular example. The principles can be extended to communications other than 10 G, other than fiber optic, other than multimode fiber and other than the LRM standard. Fibre channel and single mode fibers are two examples. Other examples include read channels for magnetic recording, SERDES, and receivers for 10 G-BaseT.

The invention also is not limited to interleaved ADCs, MLSE or DFE. Other types of interleaved devices and other types of equalizers can also be used.

In addition, although the above examples used equalizers which provided completely independent equalization for each of the interleaved channels, this also is not required. Each row in Eqn. (9) provides a set of equalizer coefficients that are dedicated entirely to a single interleaved channel and are free to vary independent of the other rows. On the other extreme, in conventional equalizers, all of the equalizer coefficients are shared by all of the interleaved channels. In Eqn. (9), this would appear as all rows having the same coefficients. Hybrid solutions are also possible. For example, some of the coefficients may be dedicated and some shared. Alternately, some of the coefficients may be shared by some but not all of the interleaved channels. As another example, separate coefficients may be provided for each interleaved channel but the coefficients may be constrained with respect to each other (i.e., not allowed to vary entirely independently of the other rows). This may, in part, be a reflection of the architecture of the interleaved device. For example, an interleaved ADC with eight ADC channels may be architected to use four T&H units, one for channels 0 and 4, one for channels 1 and 5, etc. The corresponding equalizer may use some common equalization for channels 0 and 4, for channels 1 and 5, etc.

Most of the examples described above were circuit implementations. However, this is not a requirement. Depending on the specific application, various functions can be implemented as hardware, firmware, software, and/or combinations of these. For example, the functionality can be implemented as dedicated circuitry (e.g., part of an ASIC), possibly to take advantage of lower power consumption and/or higher speed. In other applications, the functionality might be implemented as software, typically running on digital signal processors or even general-purpose processors. In addition, the term "coupled to" is not intended to mean "directly coupled to." There may be intervening elements. For example, when two elements are described as being coupled to each other, this does not imply that the elements are directly coupled to each other nor does it preclude the use of other elements between the two.

Therefore, although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. An apparatus comprising:
an interleaved analog to digital converter (ADC) having M interleaved ADC channels,
the interleaved ADC comprising:
an input port for receiving an analog input signal;
a programmable gain amplifier coupled to the input port;
M ADC channels, each coupled to an output of the programmable gain amplifier, each ADC channel including a track-and-hold unit coupled to ADC conversion circuitry;
retimer circuitry coupled to the ADC channels to combine digital output signals from the ADC channels into a digital output signal for the interleaved ADC;
an output port coupled to the retimer circuitry;
automatic gain control coupled between the retimer circuitry and the programmable gain amplifier, for adjusting a gain of the programmable gain amplifier; and
a timing recovery circuit and analog phase interpolator, coupled to an output of the retimer circuitry for adjusting a phase of a clock input to the track-and-hold units; and
a multi-channel equalizer coupled to an output of the interleaved ADC, the multi-channel equalizer capable of applying a different equalization to different interleaved ADC channels.

2. The apparatus of claim 1 wherein the multi-channel equalizer comprises a feedforward equalizer.

3. The apparatus of claim 1 wherein:
the multi-channel equalizer comprises:
a Viterbi decoder coupled to an output of the feedforward equalizer, the decoder producing an output of the multi-channel equalizer; and
a channel estimator coupled to outputs of the feedforward equalizer and the Viterbi decoder, and coupled to an input of the Viterbi decoder.

4. The apparatus of claim 1 wherein the multi-channel equalizer comprises a maximum likelihood sequence estimators (MLSE) equalizer.

5. The apparatus of claim 1 wherein the multi-channel equalizer comprises a decision feedback equalizers (DFE) equalizer.

6. The apparatus of claim 5 wherein:
the multi-channel equalizer comprises:
a feedforward equalizer coupled to the output port of the interleaved ADC;
a feedback equalizer;
a summer coupled between to receive outputs from the feedforward equalizer and the feedback equalizer; and
a slicer coupled to receive an output of the summer, an output of the slicer producing an output for the multi-channel equalizer, wherein said output is coupled to an input of the feedback equalizer.

7. The apparatus of claim 1 wherein the multi-channel equalizer comprises:
an N-tap, M-parallel impulse response (FIR).

8. The apparatus of claim 7 wherein the N-tap, M-parallel FIR comprises M processing elements, each processing element including N multipliers to multiply input signals by tap weights to produce intermediate products, and a plurality of adders to sum the intermediate products.

9. The apparatus of claim 7 wherein the N-tap, M-parallel FIR comprises M processing elements, each processing element including N lookup tables to generate intermediate products based on input signals, and a plurality of adders to sum the intermediate products.

10. The apparatus of claim 1 further comprising:
a photodetector for receiving an optical waveform transported across an optical fiber, the optical waveform carrying data.

11. The apparatus of claim 10 wherein the multi-channel equalizer comprises a maximum likelihood sequence estimators (MLSE) equalizer.

12. The apparatus of claim 10 wherein the multi-channel equalizer comprises a decision feedback equalizers (DFE) equalizer.

13. The apparatus of claim 10 wherein M=8.

14. The apparatus of claim 1 wherein the multi-channel equalizer has equalizer coefficients, each of which is dedicated exclusively to one of the M interleaved ADC channels.

15. The apparatus of claim 1 wherein the multi-channel equalizer has at least one equalizer coefficient that is shared by all M interleaved ADC channels.

16. The apparatus of claim 1 wherein the multi-channel equalizer has at least one equalizer coefficient that is shared by more than one but less than M interleaved ADC channels.

17. An apparatus comprising:
an interleaved device having M interleaved channels; and
a multi-channel equalizer coupled to the interleaved device, the multi-channel equalizer capable of applying a different equalization to different interleaved channels, the multi-channel equalizer comprising:
a feedforward equalizer coupled to an output of the interleaved device;
a decoder coupled to an output of the feedforward equalizer, the decoder producing an output of the multi-channel equalizer; and
a channel estimator coupled to outputs of the feedforward equalizer and the decoder, and coupled to an input of the decoder.

18. The apparatus of claim 17 where the interleaved device is an interleaved analog to digital converter (ADC) having M interleaved ADC channels.

19. The apparatus of claim 18 further comprising:
a photodetector for receiving an optical waveform transported across an optical fiber, the optical waveform carrying data.

20. The apparatus of claim 18 wherein M=8.

21. The apparatus of claim 18 wherein the multi-channel equalizer has equalizer coefficients, each of which is dedicated exclusively to one of the M interleaved ADC channels.

22. The apparatus of claim 18 wherein the multi-channel equalizer has at least one equalizer coefficient that is shared by all M interleaved ADC channels.

23. The apparatus of claim 18 wherein the multi-channel equalizer has at least one equalizer coefficient that is shared by more than one but less than M interleaved ADC channels.

* * * * *